United States Patent
Patel et al.

(10) Patent No.: US 12,041,747 B2
(45) Date of Patent: Jul. 16, 2024

(54) RACK FOR COOLING COMPUTING DEVICES IN A HYPERBOLOID CONFIGURATION

(71) Applicant: Core Scientific, Inc., Bellevue, WA (US)

(72) Inventors: Harsh Patel, Stone Mountain, GA (US); Devon Baldwin, Black Diamond, WA (US); Thomas Middleton Rutledge Fuller, Seattle, WA (US)

(73) Assignee: Core Scientific, Inc., Austin, TX (US)

( * ) Notice: Subject to any disclaimer, the term of this patent is extended or adjusted under 35 U.S.C. 154(b) by 60 days.

(21) Appl. No.: 17/575,184

(22) Filed: Jan. 13, 2022

(65) Prior Publication Data
US 2022/0141987 A1     May 5, 2022

Related U.S. Application Data

(63) Continuation-in-part of application No. 17/161,026, filed on Jan. 28, 2021, now abandoned.

(60) Provisional application No. 63/092,737, filed on Oct. 16, 2020.

(51) Int. Cl.
H05K 7/20     (2006.01)
H05K 7/18     (2006.01)

(52) U.S. Cl.
CPC ........... *H05K 7/18* (2013.01); *H05K 7/20172* (2013.01); *H05K 7/20718* (2013.01)

(58) Field of Classification Search
CPC ... H05K 7/18; H05K 7/20172; H05K 7/20718
USPC .................................................. 361/679.46
See application file for complete search history.

(56) References Cited

U.S. PATENT DOCUMENTS

| | | | | |
|---|---|---|---|---|
| 3,608,873 A | * | 9/1971 | Furlong | F28C 1/04 261/DIG. 11 |
| 4,267,883 A | * | 5/1981 | Maurice | E04H 5/12 261/DIG. 11 |
| 5,063,475 A | | 11/1991 | Balan | |
| 7,133,289 B2 | * | 11/2006 | Arippol | G06F 1/20 312/223.1 |

(Continued)

OTHER PUBLICATIONS

Ducted Exhaust Cabinet—Managing Exhaust Airflow Beyond Hot Aisle/Cold Aisle; Chatsworth Products, Inc.; 2009.

(Continued)

*Primary Examiner* — Anatoly Vortman
(74) *Attorney, Agent, or Firm* — Fishman Stewart PLLC

(57) ABSTRACT

A rack and system for cooling computing devices such as in a data center is disclosed. In one embodiment, the rack supports a plurality of computing devices and comprises a plurality of planar annular sector or trapezoidal shelves, each having one or more positions for holding computing devices. A number of vertical supports may hold the shelves in a vertically spaced arrangement, and an air barrier may be affixed to the rack. The air barrier may have openings for the computing devices to permit exhaust air to flow through the air barrier into a hot aisle. The rack maybe configured to be connected to other similar racks to form a vertical annular hyperboloid or a vertical hyperbolic annular paraboloid, and the computing devices may be installed to discharge exhaust at an angle relative to a centerline of the vertical annular hyperboloid or a vertical hyperbolic annular paraboloid to improve airflow.

20 Claims, 10 Drawing Sheets

(56) References Cited

U.S. PATENT DOCUMENTS

| | | | |
|---|---|---|---|
| 7,457,113 B2* | 11/2008 | Kumhyr | G06F 1/203 |
| | | | 361/679.48 |
| 7,508,663 B2* | 3/2009 | Coglitore | H05K 7/20736 |
| | | | 165/122 |
| 8,707,699 B2* | 4/2014 | Badin | F28D 1/04 |
| | | | 60/645 |
| 8,867,204 B1* | 10/2014 | Gardner | H05K 7/1497 |
| | | | 361/679.49 |
| 9,001,456 B2* | 4/2015 | Campbell | G11B 33/128 |
| | | | 360/92.1 |
| 9,151,518 B2* | 10/2015 | Olavarría Rodríguez-Arango | |
| | | | F24S 20/20 |
| 9,420,902 B2 | 8/2016 | Taylor | |
| 9,532,488 B2 | 12/2016 | Crawford | |
| 9,763,354 B1 | 9/2017 | Michaud et al. | |
| 9,773,575 B2* | 9/2017 | Malloy, III | G21C 13/10 |
| 9,839,162 B2* | 12/2017 | Crawford | H04L 41/0803 |
| 10,085,358 B2 | 9/2018 | Adiletta et al. | |
| 10,327,351 B2 | 6/2019 | McGraw et al. | |
| 10,455,743 B2* | 10/2019 | Crawford | H04L 41/0803 |
| 10,757,840 B2* | 8/2020 | Johnson | H05K 7/20836 |
| 11,516,942 B1* | 11/2022 | Baldwin | H05K 7/18 |
| 11,540,415 B2* | 12/2022 | Baldwin | H05K 7/20736 |
| 2006/0215363 A1* | 9/2006 | Shipley | H05K 7/20563 |
| | | | 361/695 |
| 2007/0064383 A1 | 3/2007 | Tanaka et al. | |
| 2008/0055848 A1 | 3/2008 | Hamburgen et al. | |
| 2012/0103843 A1* | 5/2012 | Wei | H05K 7/1497 |
| | | | 206/320 |
| 2012/0142265 A1* | 6/2012 | Wei | H05K 7/20745 |
| | | | 454/289 |
| 2015/0129514 A1 | 5/2015 | Bourdoncle et al. | |
| 2019/0174651 A1* | 6/2019 | Crawford | H05K 7/1497 |
| 2019/0335624 A1* | 10/2019 | Johnson | H05K 7/20745 |

OTHER PUBLICATIONS

Gould, P.L. and Kratzig, W.B. "Cooling Tower Structures" Structural Engineering Handbook Ed. Chen Wai-Fah Boca Raton: CRC Press LLC, 1999—Chapter 14.

https://www.quora.com/Why-is-the-shape-of-cooling-towers-in-power-plants-often-like-shown-below-in-details, various dates, including portions dated May 27, 2019, May 26, 2019, and Oct. 24, 2014 as noted in brackets.

\* cited by examiner

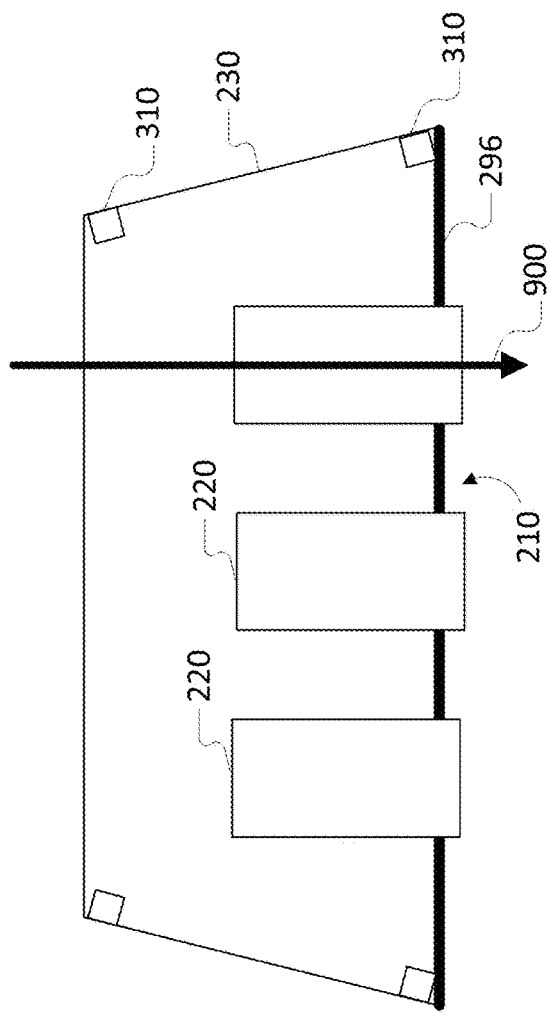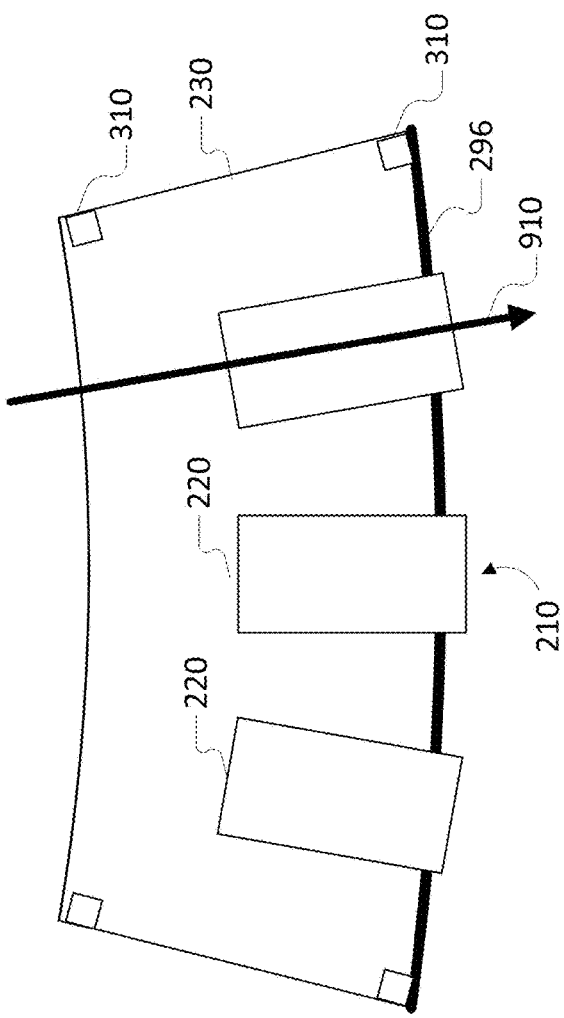

RACK FOR COOLING COMPUTING DEVICES IN A HYPERBOLOID CONFIGURATION

CROSS-REFERENCE TO RELATED APPLICATIONS

This application is a continuation-in-part application of U.S. patent application Ser. No. 17/161,026, filed on Jan. 28, 2021, and titled RACK FOR COOLING COMPUTING DEVICES IN A HYPERBOLOID CONFIGURATION, which claims priority to and the benefit of U.S. Provisional Patent Application Ser. No. 63/092,737, filed on Oct. 16, 2020, and titled "RACK FOR COOLING COMPUTING DEVICES IN A HYPERBOLOID CONFIGURATION". The contents of all of the above are hereby incorporated by reference in their entireties as though fully set forth herein.

TECHNICAL FIELD

The present disclosure generally relates to the field of computing and, more particularly, to systems and methods for cooling large numbers of computing devices such as in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute intensive workloads (e.g., rendering, AI, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional methods for improving cooling of computing devices in data centers include mixing in refrigerated air to reduce the temperature of the air that is forced across the computing device by its built-in cooling fans. A significant drawback to this approach is that refrigeration uses significant amounts of energy on top of the energy already used by the computing devices themselves.

For at least these reasons, there is a desire for a more energy efficient solution to allow for improved efficient cooling and thermal management of computing devices in a data center.

SUMMARY

A rack and system for cooling computing devices in a data center is contemplated. In one embodiment, the rack supports a plurality of computing devices and comprises a plurality of planar shelves, each having one or more positions for holding computing devices. A number of vertical supports may hold the shelves in a vertically spaced arrangement, and an air barrier may be affixed to the rack (e.g., affixed to all or a subset of the vertical supports). The air barrier may have openings for the computing devices to permit exhaust air to flow through the air barrier. The racks may be configured to be connected to other similar racks to form a vertical annular hyperboloid or vertical hyperbolic annular paraboloid. In some embodiments, the individual racks may be sectors that join together to form a vertical hyperbolic rack (e.g., a vertical hyperbolic annular paraboloid rack or vertical hyperboloid rack). In other embodiments, the hyperbolic rack may be a single unit.

The shelves may for example be annular sectors or trapezoidal (e.g., still yielding a vertical annular hyperboloid, but with facets). The air barrier may form the inside surface of the hyperboloid/paraboloid, with the computing devices exhausting air into the inside hyperboloid/paraboloid, or the outside surface of the vertical annular hyperboloid/paraboloid, with the computing devices exhausting air out of the hyperboloid/paraboloid.

The computing devices may be positioned to exhaust air toward the centerline of the vertical annular hyperboloid/paraboloid, or at a horizontal angle relative to a radius from the centerline of the vertical annular hyperboloid. The computing devices may also be positioned to exhaust air horizontally (e.g., parallel with the ground), or at a vertical angle relative to horizontal (e.g., pointing partially upward). One or more angled shims may be used for positioning the computing devices at the desired angle for improved airflow and cooling.

In another embodiment the rack comprises a plurality of annular sector or trapezoidal planar shelves, each having one or more positions for holding computing devices and a plurality of vertical supports configured to hold the planar shelves in a vertically spaced arrangement. The rack may also be configured to be connected to other racks to form a vertical annular hyperboloid or a vertical hyperbolic annular paraboloid.

A system for cooling computing devices in a data center is also contemplated. In one embodiment, the system comprises a hyperboloid or paraboloid rack with a plurality of annular shelves and vertical supports. Each annular shelf may have one or more positions (e.g., spaces or trays) for holding one of the computing devices. The vertical supports may be configured to hold the planar shelves in a vertically spaced arrangement, and a vertical hyperboloid air barrier with openings for the computing devices may be affixed to the rack (e.g., to the inside or outside of the hyperboloid or paraboloid rack).

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

FIG. 9A is top-down view of another embodiment of a trapezoidal shelf and portion of a rack for cooling computing devices according to the teachings of the present disclosure.

FIG. 9B is top-down view of another embodiment of an annular sector shelf and portion of a rack for cooling computing devices according to the teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Figure 1:
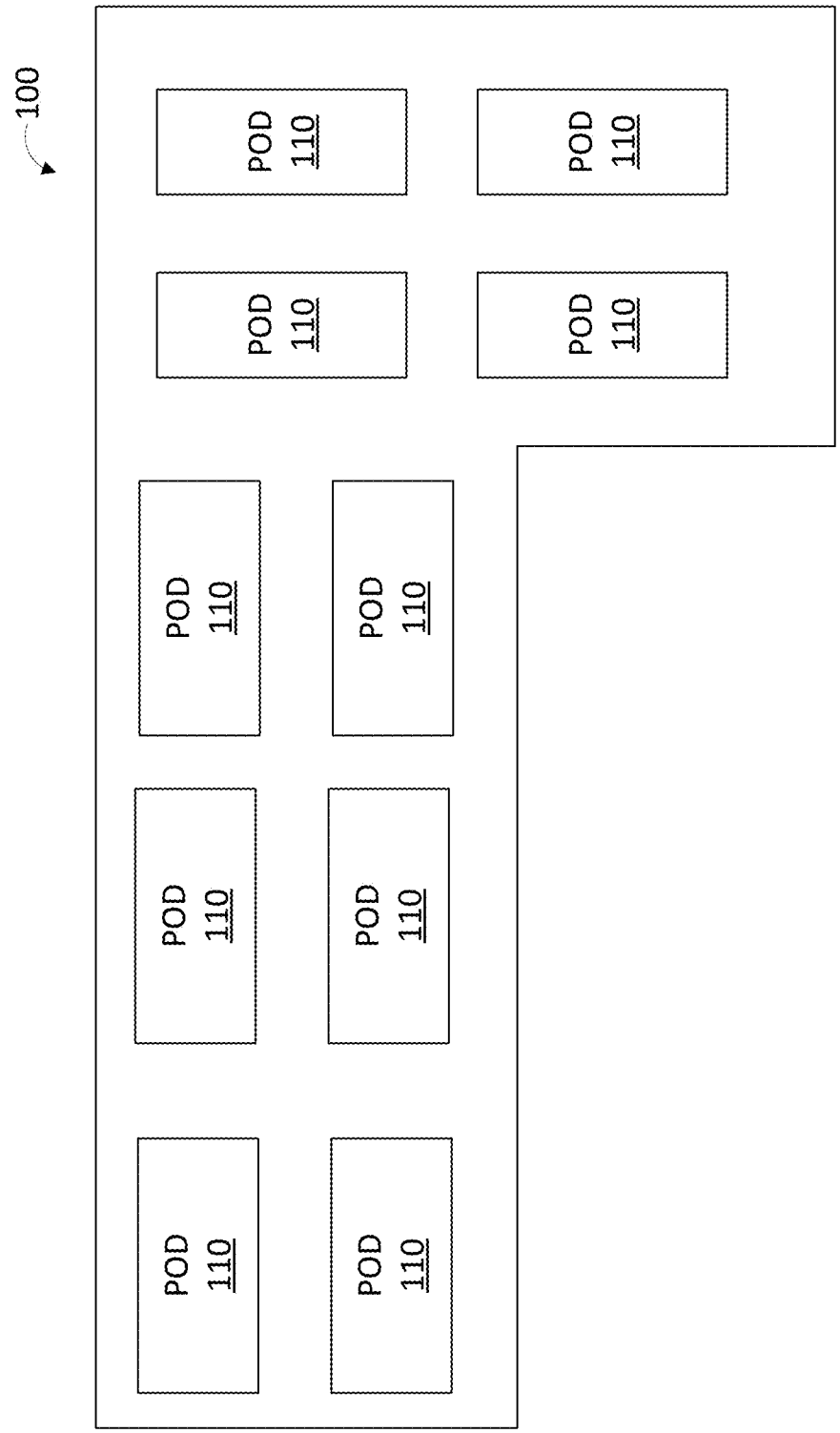
FIG. 1 is a top-down view of one example embodiment of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned at one end of each pod or above the center of each pod) to capture the hot waste air and then discharge it out of the data center via vents in the roof of the data center.

Figure 2:
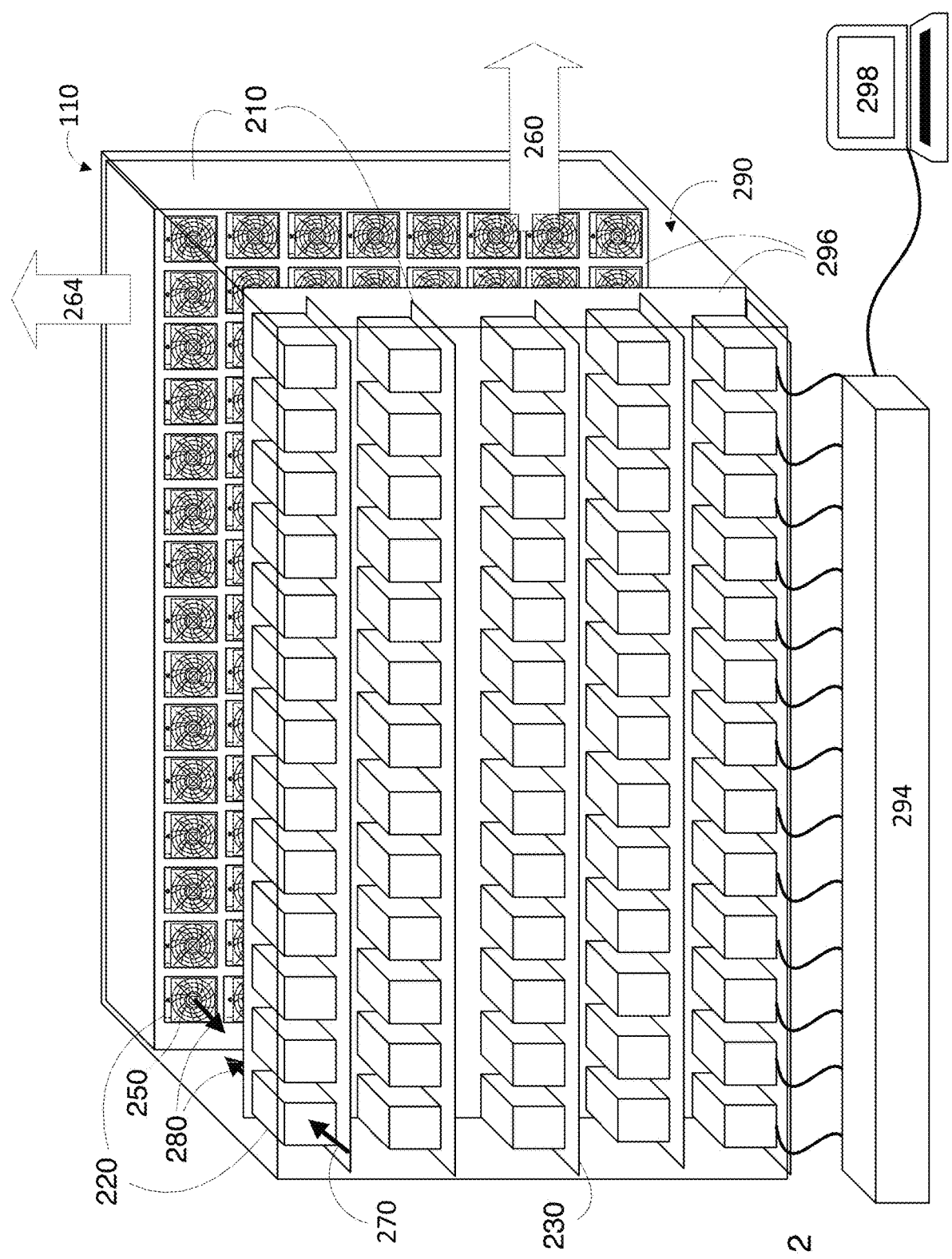
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of or in addition to shelves 230. Each computing device 220 has one or more cooling fans 250 configured to draw air from outside the pod into the computing device for cooling, as shown by arrow 270. The moving air draws heat from computing device 220 and is exhausted from the computing device as shown by arrows 280.

In some embodiments, computing device 220 may have two fans, one on the intake side and one on the exhaust side. In other embodiments multiple smaller fans may be used within computing device 220 (e.g., next to each other working in parallel, or one behind the other working in series). Heated air is exhausted by computing devices 220 into the space between racks 210, called a hot aisle 290. The space between racks 210 is typically sealed except for one or more exhaust openings through which the heated air exits.

In some embodiments, these openings may be at the side, with heated air exiting as indicated by arrow 260. In other embodiments, these exhaust openings may be located at the top of hot aisle 290 with the heated air exiting above the pod as indicated by arrow 264. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents.

Computing devices 220 are networked together with network switch 294 and may be organized by mapping physical computing device positions within the pod, rack and shelf by the network ports on switch 294. This network connection allows management instructions and computing jobs to be sent to each computing device 220, and data such as device status information (e.g., temperature information, fan speed) and results of the computing jobs to be returned. Switch 294 may also be connected to other networks such as the internet, as well as a management computer 298 that is configured to execute a management application to manage computing devices 220. Management computer 298 may be a traditional PC or server, or specialized appliance. Management computer 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the management computer 298 as a stand-alone software package, partly on the management computer 298 and partly on a remote computer or computing devices 220, or entirely on a remote computer or computing devices 220.

In order to better cool computing devices 220, the management application may be configured to dispatch instructions to computing devices 220 to dynamically adjust their fan speeds (e.g., based on temperature information). While different computing devices will have different interfaces for setting fan speed, one example is that the computing device will have a network port open that will accept management commands such as setting the fan speed, voltage level, operating frequency, etc. The management application may provide a user interface for simplified management. For example, the management application may be configured to create a model of the data center based on device to port mappings and permit the user to specify a maximum setting (e.g., maximum fan setting), a minimum setting (e.g., minimum fan settings), and a type of fan speed pattern (e.g., linear gradient or cubic) across multiple computing devices. With this information, the management application may then automatically calculate the values (e.g., fan speed settings) for each computing device based on the distribution of the computing devices on the rack. In another embodiment, the management application may allow the user to manually override one or more of the settings for different computing devices or groups of computing devices. The management application may also prompt the user to specify timing and the direction for any desired shifts or rotations of the patterns.

While the illustrated examples show the computing devices 220 arranged in two-dimensional arrays that are planar and perpendicular to the floor, other arrangements are possible and contemplated. For example, the two-dimensional array may be sloped or angled relative to the floor (e.g., with each shelf angled and or offset from the one below it) and or non-planar (e.g., with each shelf angled and or offset from the one next to it).

Figure 3:
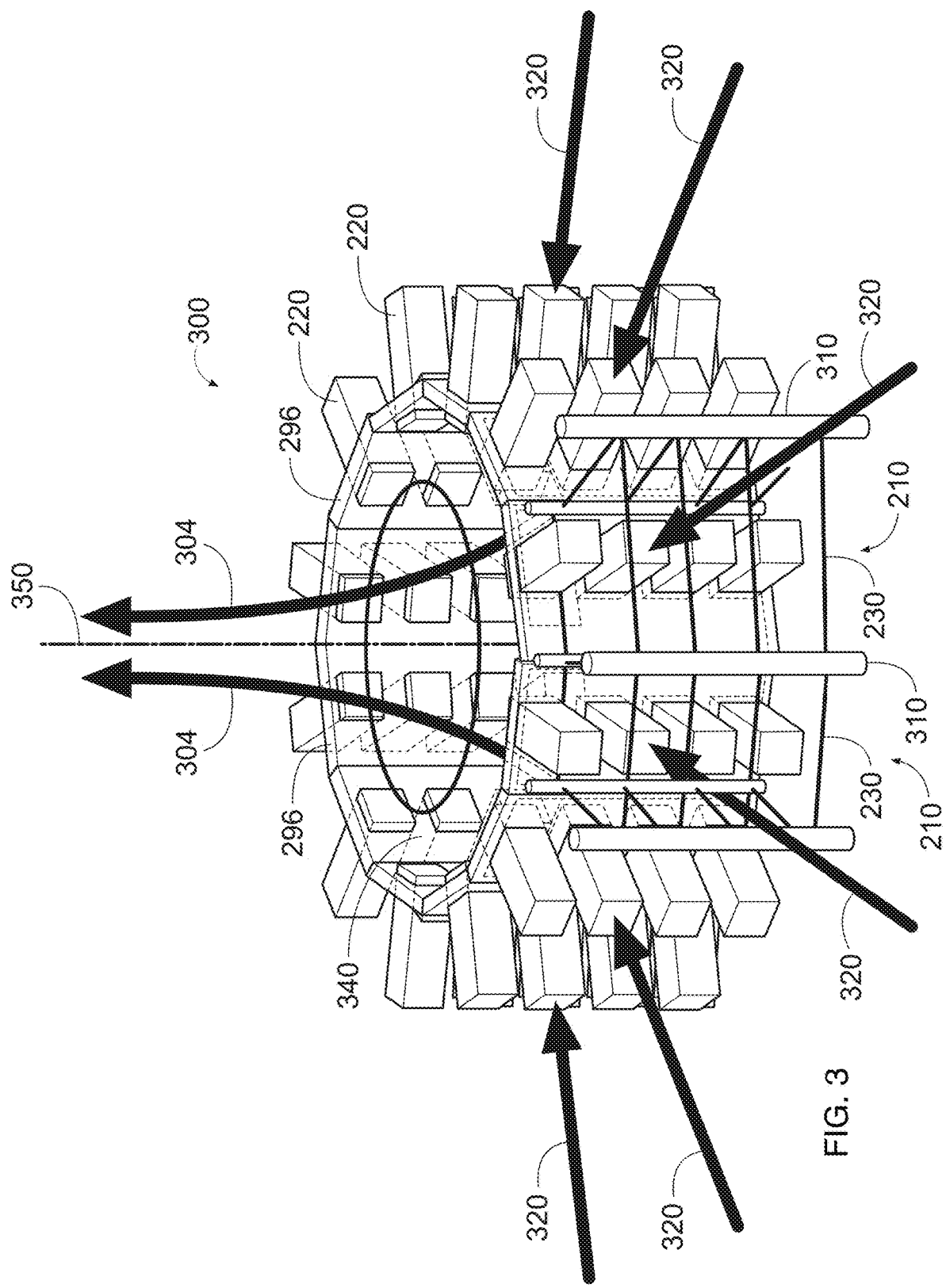
FIG. 3 is a perspective view of one example embodiment of a rack for cooling computing devices according to the teachings of the present disclosure.

Turning now to FIG. 3, a perspective view of one example embodiment of a rack for cooling computing devices according to the teachings of the present disclosure is shown. In this embodiment, each rack 210 is configured to be connected to two other racks to form a vertical annular cylinder 300. This rounded shape may improve airflow and reduce hotspots, thereby improving cooling. Each rack 210 may be configured with a number of individual planar shelves 230 that are supported by vertical support members 310 and hold the planar shelves 230 in a vertically spaced arrangement. The racks 210 may be configured to be affixed to each other (e.g., with clamps or screws) in order to increase the stability and rigidity of the cylinder 300. Vertical support members 310 and shelves 230 may be constructed of many different types of rigid materials suitable for supporting the weight of computing devices 220, e.g., aluminum, steel, plastic, wood or other rigid materials. While four vertical support members 310 are shown for each rack 210, in other embodiments different numbers of supports may be used (e.g., three on each side for a total of six per rack, or one solid panel on each side for a total of two support members per rack). Similarity, in this example, shelves 230 are shown each holding one computing device 220, but implementations with multiple computing devices 220 on each shelf are possible and contemplated, and not all shelves may have a computing device on them (e.g., some shelves may be empty due to devices not being available or being repaired). Note that in this example and following examples, some or all of shelves 230 and support members 310 are omitted for clarity.

In this configuration, computing devices 220 take in cool air from outside the cylinder 300 as indicated by arrows 320. The cool air passes through the computing devices 220, extracts waste heat, and is exhausted into the inside of the cylinder 300. In this embodiment, computing devices 220 are positioned to exhaust air toward the centerline 350 of the vertical annular cylinder 300. The large number of computing devices 220 all exhausting heated air into the inside of cylinder 300 causes a buildup in pressure and drives out the heated air through one or more exhaust vents 340 that are located at the top of cylinder 300. This air flow is illustrated by arrows 304. The inside of the cylinder 300 may be sealed by air barriers 296 such that the heated exhaust air can generally only escape through exhaust vent 340 and generally cannot escape back into the cold aisle where computing devices 220 draw in their cool air. For example, air barriers 296 may be structural foam sheets that are attached to racks 210 (e.g., by being glued or screwed to vertical support members 310 and or shelves 230) and are sealed to the adjacent air barriers to reduce leaks (e.g., with tape or caulking). The air barriers may be similarly sealed to the ceiling and floor of the data center to prevent hot air from escaping back into the cold aisle.

In some embodiments, the fans in computing devices 220 may be adjusted based on their position relative to the height of cylinder 300. For example, computing devices 220 that are near the top of cylinder 300 and closer to exhaust vent 340 may have their fan speed attenuated relative to the fan speed of computing devices 220 that are positioned on shelves 230 that are lower on cylinder 300. This may improve air flow and may reduce the energy used compared with running the fans at a higher speed than needed for cooling.

While exhaust vent 340 is shown in this example as being smaller than the diameter of cylinder 300, in other embodiments the exhaust vent 340 may be as large as the inner diameter of annular cylinder 300. In the illustrated embodiment, each rack 210 is the same size and shape, but in other embodiments some of racks 210 may have different shapes (e.g., pairs of racks opposite each other may be elongated or rectangular). This would still result in a vertical annular cylinder, albeit one that this is not completely symmetrical.

Figure 4:
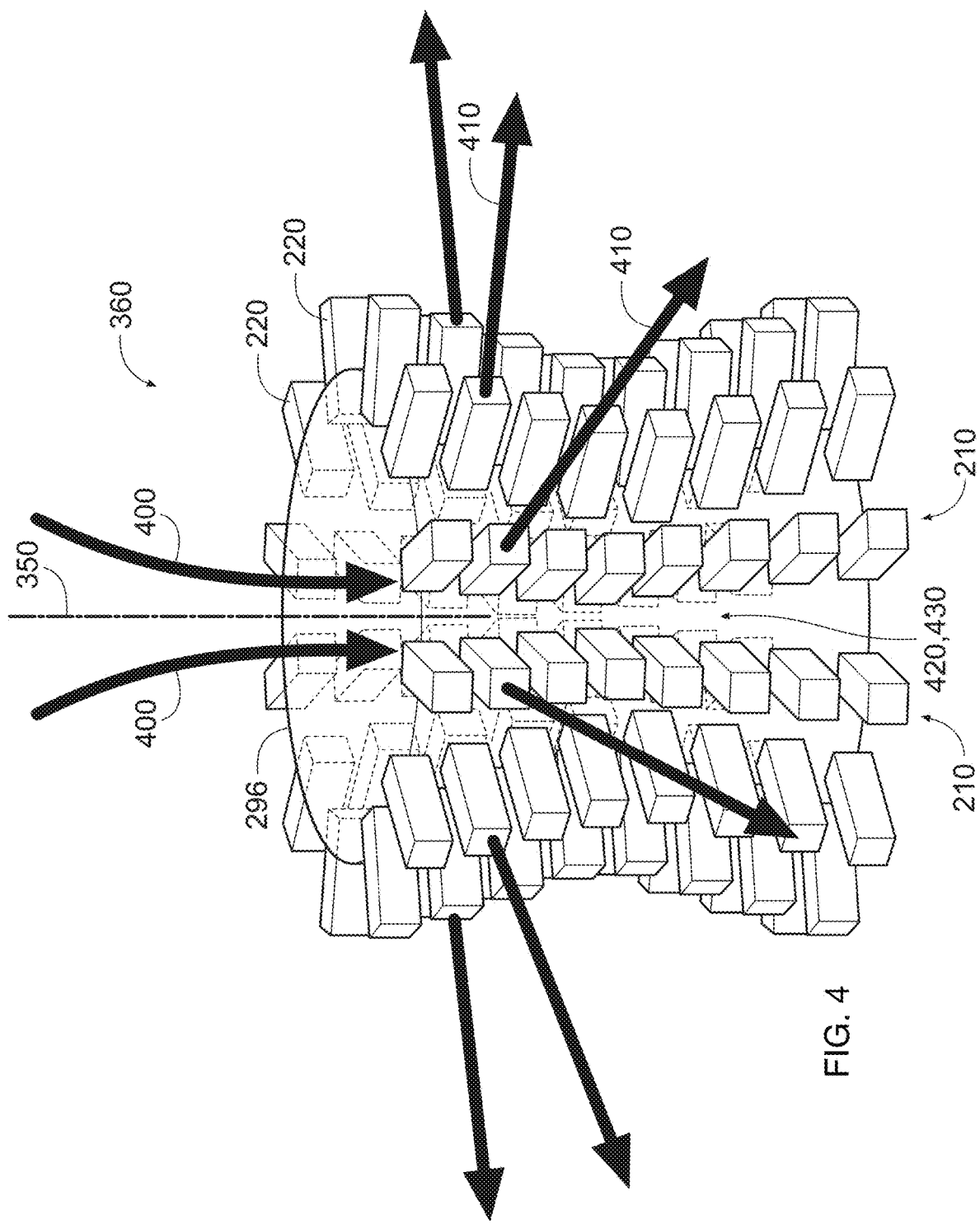
FIG. 4 is a perspective view of another example embodiment of a rack for cooling computing devices according to the teachings of the present disclosure.

Turning now to FIG. 4, a perspective view of another example embodiment of a rack for cooling computing devices according to the teachings of the present disclosure is shown. In this embodiment, each rack 210 is configured to be connected to two other racks to form a vertical annular hyperboloid 360, and computing devices 220 are configured to draw cool air in from the center of vertical annular hyperboloid 360 (as shown by arrows 400) and exhaust the air outside the vertical annular hyperboloid 360 (as shown by arrows 410). For example, in some configurations, cool air may be drawn into one or both ends of the vertical annular hyperboloid and air may be exhausted through/across computing devices 220, such as in a generally radially outward direction, which may facilitate cooling of the computing devices 220. While air barriers 296 are shown at the inside of vertical annular hyperboloid 360, other positions are possible and contemplated (e.g., at the outside of vertical annular hyperboloid 360).

In some embodiments, the shape of hyperboloid 360 may improve cooling (e.g., of computing devices 220) due to the constriction 420 inherent in the hyperbolic shape. The constriction 420 of the vertical annular hyperboloid 360 may correspond to an area of the shelves 230 and/or the air barrier 296 having a reduced inner diameter, such as compared to the ends of the vertical annular hyperboloid 360 that may correspond to larger diameters. When air moves into this constriction 420, the air may speed up, which may reduce air pressure and/or create a lower pressure region 430 (e.g., inside the air barrier 296), such as due to the Venturi effect. This lower pressure region 430 may assist in drawing air into/through the hyperboloid 360, the rack 210, and/or the shelves 230 (e.g., drawing cool air in and/or moving hot air out), which may increase the efficiency of cooling the computing devices 220.

In some embodiments, the speed of the fans of the computing devices 220 may be varied to enhance the pressure differential for the lower pressure region (e.g., fan speeds may vary based on relative distance from the constriction 420), which may further increase airflow speed through the rack and/or the hyperboloid, and/or further increase the efficiency of cooling the computing devices 220. For example, a method of operating computing devices 220 and/or utilizing one or more racks 210 may include a management computer 298 controlling fan speeds of computing device fans according to distance from the constriction 420. In addition to improved airflow, round or rounded rack configurations, such as parabolic or hyperboloid racks, may also have strength advantages (e.g., improved rigidity) and/or may require less materials than traditional rectangular rack structures.

Figure 5:
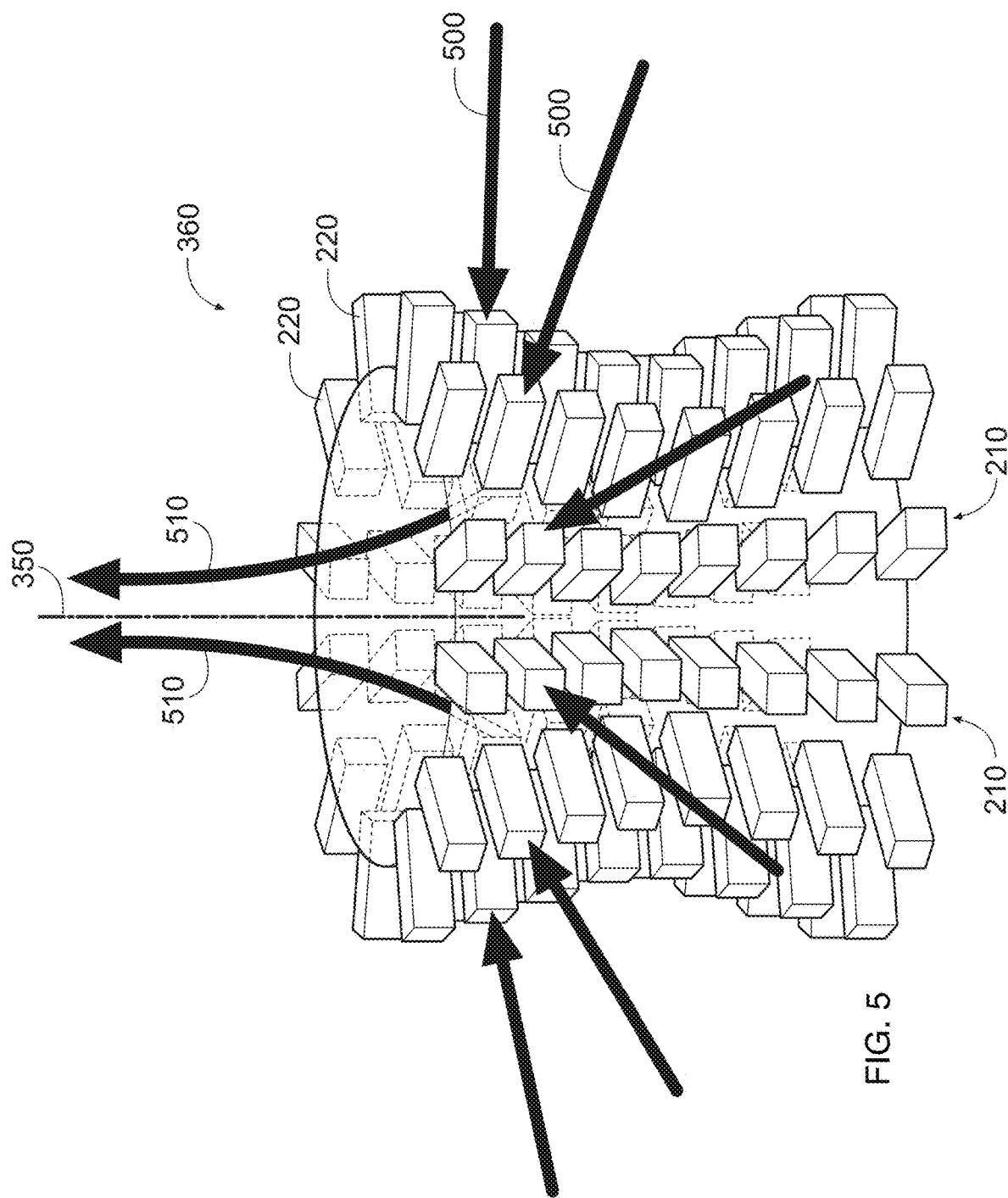
FIG. 5 is a perspective view of yet another example embodiment of a rack for cooling computing devices according to the teachings of the present disclosure.

Turning now to FIG. 5, a perspective view of yet another example embodiment of a rack for cooling computing devices according to the teachings of the present disclosure is shown. In this embodiment, computing devices 220 are positioned to intake cool air from outside the vertical annular hyperboloid 360 as shown by arrows 500 and exhaust air toward the centerline 350 of the vertical annular hyperboloid 360, where the pressure causes the air to exit out the top exhaust opening of hyperboloid 360 as shown by arrows 510.

Figure 6:
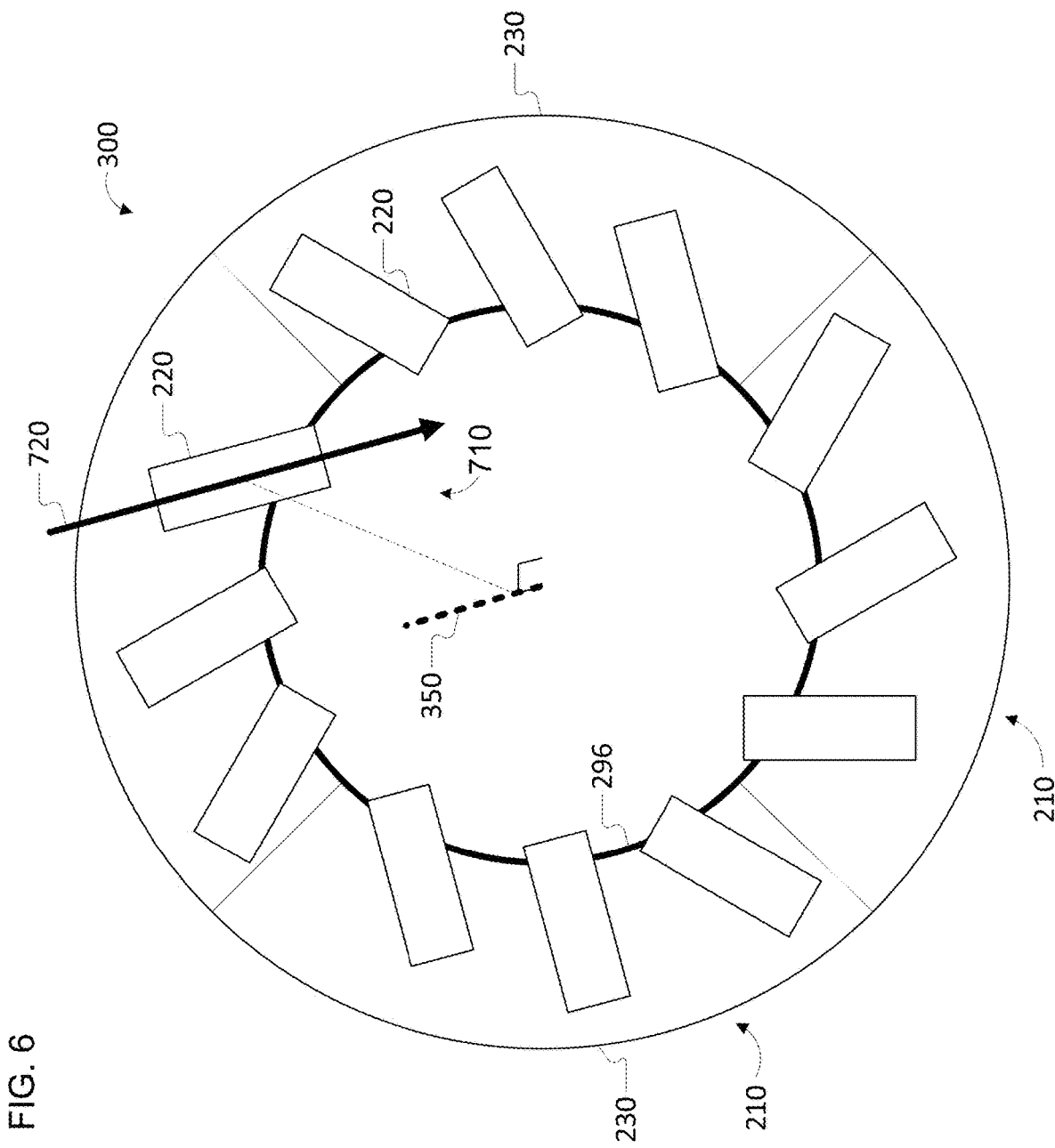
FIG. 6 is a top down view of a cross-section of another example embodiment of a rack for cooling computing devices according to the teachings of the present disclosure.

Turning now to FIG. 6, a top down view of yet another example embodiment of a rack for cooling computing devices according to the teachings of the present disclosure is shown. In this embodiment, computing devices 220 are positioned to intake cool air from outside the vertical annular cylinder 300 and exhaust hot air at a horizontal angle 710 relative to the centerline 350 of the vertical annular cylinder 300, as shown by arrow 720. In this embodiment, three computing devices 220 are positioned on each shelf 230 shown of each rack 210. Two facilitate exhausting air at an angle, computing devices 220 maybe mounted or positioned at an angle on shelves 230.

Figure 7:
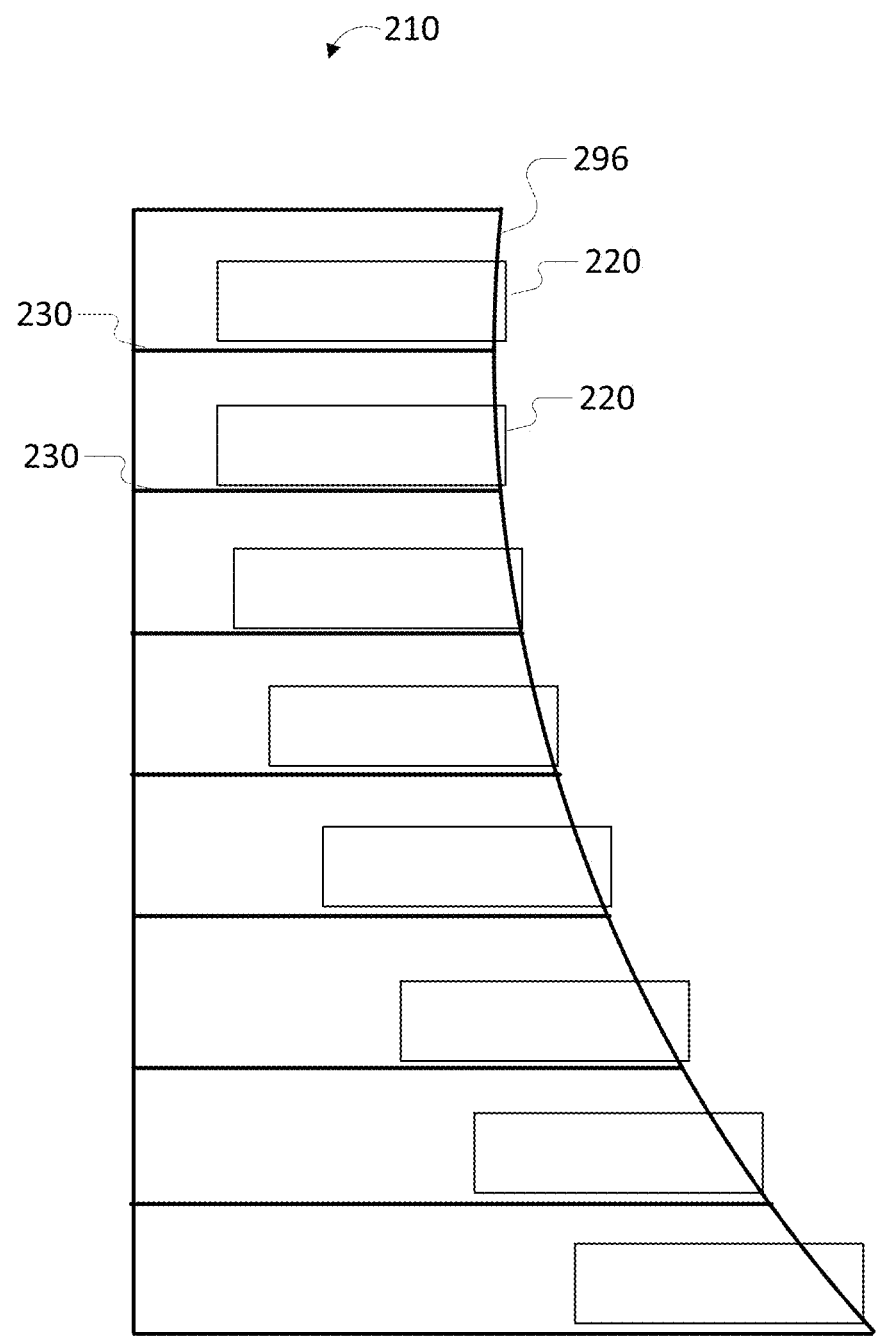
FIG. 7 is a side cross section view of still another example embodiment of a rack for cooling computing devices according to the teachings of the present disclosure.

Turning now to FIG. 7, a side cross-section view of one embodiment of a rack for cooling computing devices according to the teachings of the present disclosure is shown. In this embodiment, rack 210 has one curved side defined by air barrier 296 and forms a vertical annular paraboloid when connected to other racks rather than a hyperboloid. Shelves 230 may be curved on one or more sides as shown in connection with the following figures.

Figure 8A:
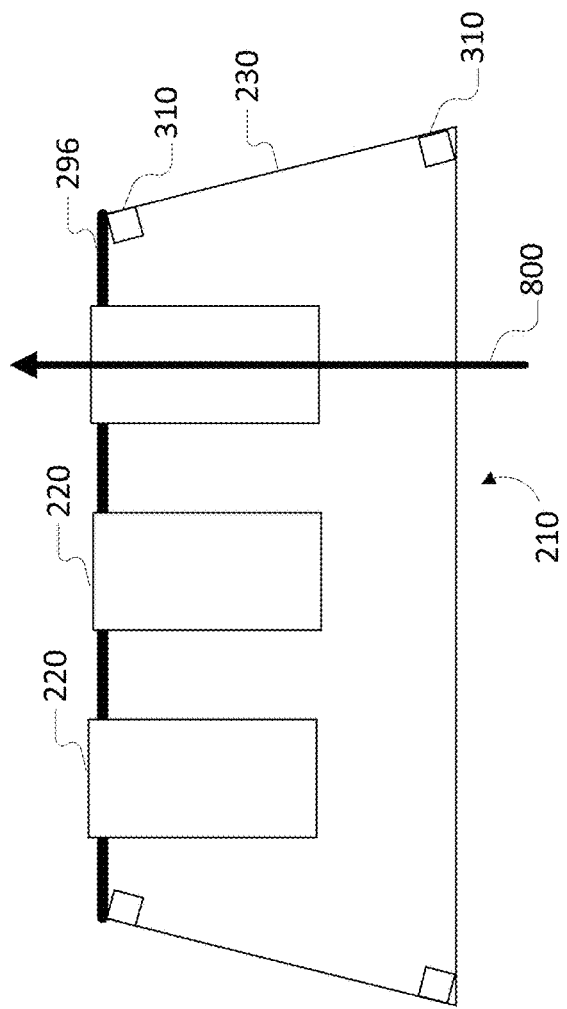
FIG. 8A is top-down view of one embodiment of a trapezoidal shelf and portion of a rack for cooling computing devices according to the teachings of the present disclosure.

Turning now to FIG. 8A, a top-down view of an embodiment of a trapezoidal shelf and portion of a rack for cooling computing devices according to the teachings of the present disclosure is shown. In this embodiment, shelf 230 is a planar trapezoid, is supported by 4 vertical support members 310, and has positions (e.g., trays, brackets, areas) for supporting three computing devices 220. In this embodiment, air barrier 296 is affixed to support members 310 on the side of rack 210 forming the inside of the vertical annular hyperboloid or paraboloid and has exhaust openings for each of computing devices 220. Computing devices 220 pull in cool air from outside the vertical annular hyperboloid or paraboloid formed by combining multiple racks 210 and exhaust heated air into the inside of the vertical annular hyperboloid or paraboloid as shown by arrow 800.

Figure 8B:
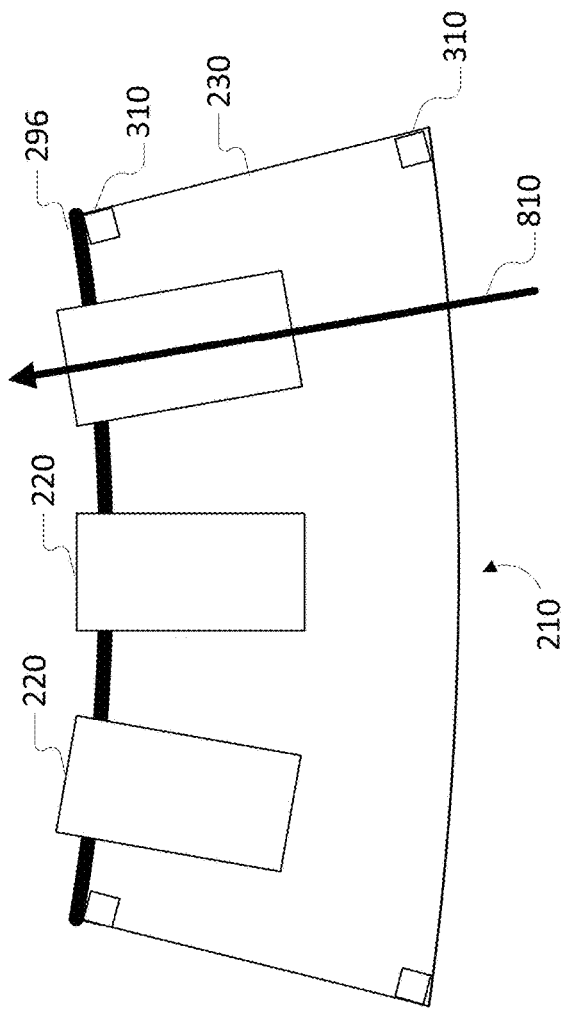
FIG. 8B is top-down view of one embodiment of an annular sector shelf and portion of a rack for cooling computing devices according to the teachings of the present disclosure.

Turning now to FIG. 8B, a top-down view of an embodiment of an annular sector shelf and portion of a rack for cooling computing devices according to the teachings of the present disclosure is shown. In this embodiment, shelf 230 is an annular sector, is supported by 4 vertical support members 310, and has positions (e.g., trays, brackets, areas) for supporting three computing devices 220. As with the previous example, air barrier 296 is affixed to support members 310 and has exhaust openings for each of computing devices 220. Computing devices 220 pull in cool air from outside the vertical annular hyperboloid or paraboloid formed by combining multiple racks 210 and exhaust heated air into the inside of the vertical annular hyperboloid or paraboloid as shown by arrow 810.

Combinations of annular sectors and trapezoidal shapes are also possible and contemplated (e.g., a trapezoid with a curved interior or exterior side). As noted in the illustrations, flat sides on the inside or outside still create a vertical annular hyperboloid or paraboloid, albeit with facets. To ensure improved airflow, when using flat sides a sufficient number of racks may be used to keep the angles between the facets greater than 100 degrees.

Turning now to FIG. 9A, a top-down view of another embodiment of a trapezoidal shelf and portion of a rack for cooling computing devices according to the teachings of the present disclosure is shown. In this embodiment, shelf 230 is a planar trapezoid, is supported by 4 vertical support members 310, and has positions (e.g., trays, brackets, areas) for supporting three computing devices 220. Air barrier 296 is affixed to support members 310 on the side of rack 210 forming the outside of the vertical annular hyperboloid or paraboloid and has exhaust openings for each of computing devices 220. In this embodiment, computing devices 220 pull in cool air from inside the vertical annular hyperboloid or paraboloid formed by combining multiple racks 210 and exhausts heated air to the outside of the vertical annular hyperboloid or paraboloid as shown by arrow 900.

Turning now to FIG. 9B, a top-down view of another embodiment of an annular sector shelf and portion of a rack for cooling computing devices according to the teachings of the present disclosure is shown. In this embodiment, shelf 230 is a planar annular sector, is supported by 4 vertical support members 310, and has positions (e.g., trays, brackets, areas) for supporting three computing devices 220. Air barrier 296 is affixed to support members 310 on the side of rack 210 forming the outside of the vertical annular hyperboloid or paraboloid and has exhaust openings for each of computing devices 220. In this embodiment, computing devices 220 pull in cool air from inside the vertical annular hyperboloid or paraboloid formed by combining multiple racks 210 and exhaust heated air to the outside of the vertical annular hyperboloid or paraboloid as shown by arrow 910.

Figure 10:
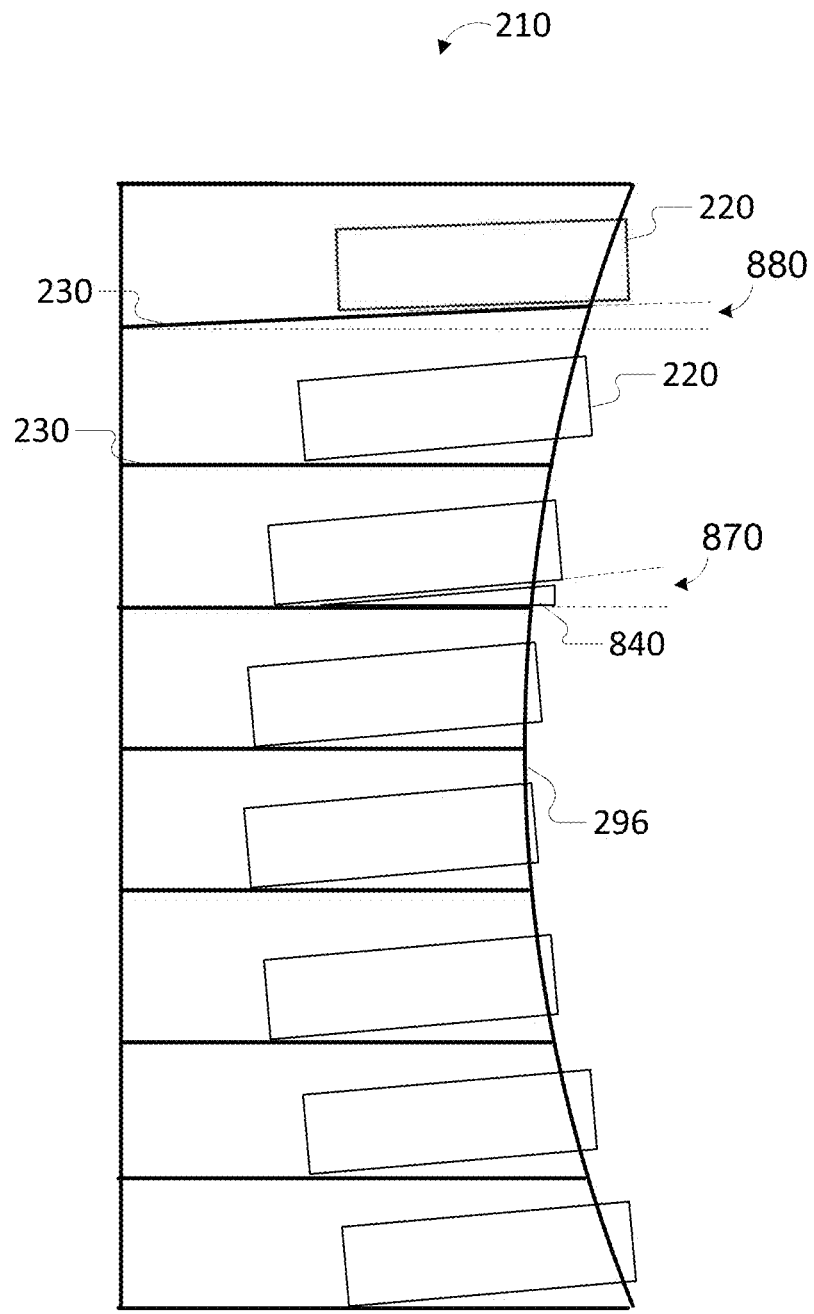
FIG. 10 is side cross section view of one embodiment of a rack for cooling computing devices according to the teachings of the present disclosure.

Turning now to FIG. 10, a side cross-section view of one embodiment of a rack for cooling computing devices according to the teachings of the present disclosure is shown. In this embodiment, computing devices 220 are positioned on shelves 230 in rack 210 to exhaust air at a vertical angles 870 and 880 relative to horizontal. This may improve airflow and cooling and reduce the amount of power used in some embodiments. To achieve the vertical angle 870, in some embodiments the shelves 230 may themselves be positioned at an angle relative to horizontal, or shims 840 may be used. For example, a set of shims with different angles may be used (e.g., shims with different angles for each level of shelves in the rack). This type of positioning of computing devices 220 with vertical angles may be used in combination with the different embodiments of rack 210 disclosed herein.

Reference throughout the specification to "examples," "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

In examples, a computer/computing device may include an electronic controller and/or include an electronic processor, such as a programmable microprocessor and/or microcontroller. In embodiments, a computing device may include, for example, an application specific integrated circuit (ASIC). A computing device may include a central processing unit (CPU), a memory (e.g., a non-transitory computer-readable storage medium), and/or an input/output (I/O) interface. A computing device may be configured to perform various functions, including those described in greater detail herein, with appropriate programming instructions and/or code embodied in software, hardware, and/or other medium. In embodiments, a computing device may include a plurality of controllers. In embodiments, a computing device may be connected to a display, such as a touchscreen display.

It should be understood that a computer/computing device, an electronic control unit (ECU), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A rack for supporting a plurality of computing devices, the rack comprising:
   a plurality of planar shelves, wherein each of the planar shelves has one or more positions to hold one of the computing devices;
   a plurality of vertical supports that hold the planar shelves in a vertically spaced arrangement; and
   an air barrier affixed to the rack and separating a cold aisle from a hot aisle, the air barrier having openings structured to permit exhaust air to flow through the air barrier to the hot aisle and block the exhaust air from escaping back into the cold aisle, wherein the rack is connected to other racks to form a vertical annular hyperboloid; the computing devices have cooling fans arranged to exhaust air through the openings of the air barrier into the inside of the vertical annular hyperboloid; and cooling fans of the computing devices are adjusted based on vertical position relative to the height of the vertical annular hyperboloid.

2. The rack of claim 1, wherein the planar shelves are annular sectors.

3. The rack of claim 1, wherein the planar shelves are trapezoidal.

4. The rack of claim 1, wherein the air barrier forms an inside surface of the vertical annular hyperboloid.

5. The rack of claim 4, wherein the vertical annular hyperboloid is configured to create a lower pressure region that increases airflow through the rack.

6. The rack of claim 5, wherein the computing devices are positioned to exhaust air around a centerline of the vertical annular hyperboloid.

7. The rack of claim 6, wherein the computing devices are positioned to exhaust air at a vertical angle relative to a horizontal plane substantially perpendicular to the plurality of vertical supports.

8. The rack of claim 6, wherein the computing devices are positioned to exhaust air at a horizontal angle relative to the centerline of the vertical annular hyperboloid.

9. The rack of claim 1, wherein the air barrier forms the outside of the vertical annular hyperboloid.

10. The rack of claim 9, wherein the computing devices have cooling fans and exhaust air to the outside of the vertical annular hyperboloid.

11. The rack of claim 10, wherein the computing devices are positioned to exhaust air away from a centerline of the vertical annular hyperboloid.

12. The rack of claim 11, wherein the cooling fans are positioned to exhaust air at a vertical angle relative to horizontal.

13. The rack of claim 11, wherein the computing devices are positioned to exhaust air at a horizontal angle relative to a radius from the centerline of the vertical annular hyperboloid.

14. The rack of claim 1, further comprising an angled shim for positioning the computing devices at a vertical angle relative to horizontal.

15. A system for cooling a plurality of computing devices in a data center, the system comprising:
   a hyperboloid rack comprising a plurality of annular shelves and vertical supports, wherein each of the annular shelves has a plurality of positions that hold one of the computing devices;
   a plurality of vertical supports that hold the annular shelves in a vertically spaced arrangement; and
   a vertical hyperboloid air barrier affixed to the hyperboloid rack and having an opening for each of the computing devices
   wherein the vertical hyperboloid air barrier has a constriction that creates a lower pressure region that draws air through the hyperboloid rack; and fan speeds of one or more fans of the plurality of computing devices are adjusted based on vertical positions along the hyperboloid rack.

16. The system of claim 15, wherein the vertical hyperboloid air barrier is affixed to the outside of the hyperboloid rack.

17. The system of claim 15, wherein the vertical hyperboloid air barrier is affixed to the inside of the hyperboloid rack.

18. A rack for supporting a plurality of computing devices, the rack comprising:
   a plurality of planar shelves, wherein each of the planar shelves has one or more positions that hold one of the computing devices and is an annular sector or a trapezoid; and
   a plurality of vertical supports that hold the planar shelves in a vertically spaced arrangement, wherein the rack is connected to other racks to form a vertical annular hyperboloid or a vertical hyperbolic annular paraboloid; and fan speeds of one or more fans of the plurality of computing devices vary relative to vertical and horizontal positions of the plurality of computing devices relative to the formed vertical annular hyperboloid or the vertical hyperbolic annular paraboloid.

19. The rack of claim 18, further comprising an air barrier affixed to the plurality of planar shelves and at least a subset of the vertical supports, wherein the air barrier forms the inside of the vertical hyperbolic annular paraboloid.

20. The rack of claim 18, further comprising an air barrier affixed to the plurality of planar shelves and at least a subset of the vertical supports, wherein the air barrier forms the outside of the vertical hyperbolic annular paraboloid.

* * * * *